United States Patent
Frauwallner et al.

(10) Patent No.: US 11,523,496 B2
(45) Date of Patent: Dec. 6, 2022

(54) COOLING PROFILE INTEGRATION FOR EMBEDDED POWER SYSTEMS

(71) Applicant: AT&S Austria Technologie & Systemtechnik Aktiengesellschaft, Leoben (AT)

(72) Inventors: Rainer Frauwallner, Tragöss-St. Katharein (AT); Dietmar Drofenik, Spielberg (AT); Patrick Fleischhacker, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/249,084

(22) Filed: Feb. 19, 2021

(65) Prior Publication Data

US 2021/0267044 A1    Aug. 26, 2021

(30) Foreign Application Priority Data

Feb. 20, 2020    (EP) .................................... 20158509

(51) Int. Cl.
  *H05K 1/18*    (2006.01)
  *H05K 1/02*    (2006.01)
  *H05K 3/46*    (2006.01)

(52) U.S. Cl.
  CPC ........... *H05K 1/0207* (2013.01); *H05K 1/182* (2013.01); *H05K 1/183* (2013.01); *H05K 1/184* (2013.01); *H05K 1/185* (2013.01); *H05K 3/4644* (2013.01)

(58) Field of Classification Search
  CPC ......... H05K 1/182–185; H05K 1/0207; H05K 3/4644; H05K 2201/10545; H05K 2201/1056; H05K 2201/10553; H05K 2203/1572; H05K 2201/10166; H05K 2203/063; H05K 2201/10272; H05K 1/0373; H05K 2201/0195; H05K 2201/0209; H05K 2201/10416; H05K 2201/066; H05K 3/0061; H05K 1/0263; H05K 1/0204; H01L 23/3677;
  (Continued)

(56) References Cited

U.S. PATENT DOCUMENTS 7,547,966 B2 * 6/2009 Funakoshi .......... H01L 23/4334
                                                  257/707
9,107,290 B1 * 8/2015 Chen .................... H01L 25/074
  (Continued)

OTHER PUBLICATIONS

Schweiger, D.; Extended European Search Report in Application No. EP 20 15 8509.8; pp. 1-8; Aug. 7, 2020; European Patent Office; 80298, Munich, Germany.

*Primary Examiner* — Steven T Sawyer
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure. A component is embedded in the stack. A first thermally conductive block is located above and thermally connected with the component, and a second thermally conductive block is located below and thermally coupled with the component. Heat generated by the component during operation is removed via at least one of the first thermally conductive block and the second thermally conductive block.

13 Claims, 2 Drawing Sheets

(58) Field of Classification Search
CPC .............. H01L 23/5389; H01L 24/20; H01L 2224/04105; H01L 2224/2518; H01L 23/367; H01L 21/50; H01L 23/49822; H01L 23/49838
See application file for complete search history.

(56) References Cited

U.S. PATENT DOCUMENTS

| | | | |
|---|---|---|---|
| 2002/0157859 A1* | 10/2002 | Vasoya | B32B 27/12 |
| | | | 174/250 |
| 2008/0122061 A1* | 5/2008 | Edwards | H01L 24/25 |
| | | | 257/E23.105 |
| 2010/0027228 A1* | 2/2010 | Tsukada | H01L 24/01 |
| | | | 361/772 |
| 2013/0181228 A1* | 7/2013 | Usui | H01L 24/97 |
| | | | 257/77 |
| 2015/0084207 A1 | 3/2015 | Chauhan et al. | |
| 2015/0255380 A1* | 9/2015 | Chen | H01L 23/49827 |
| | | | 361/707 |
| 2016/0021753 A1* | 1/2016 | Tomikawa | H05K 3/4697 |
| | | | 361/761 |
| 2016/0133558 A1 | 5/2016 | Stahr et al. | |
| 2017/0092630 A1* | 3/2017 | Weis | H01L 24/17 |
| 2018/0269146 A1 | 9/2018 | Palm | |
| 2019/0198424 A1* | 6/2019 | Lam | H01L 23/13 |
| 2019/0355644 A1 | 11/2019 | Zhong et al. | |

* cited by examiner

COOLING PROFILE INTEGRATION FOR EMBEDDED POWER SYSTEMS

CROSS-REFERENCE TO RELATED APPLICATION

The present application claims the benefit of the filing date of the European Patent Application EP20158509.8, filed Feb. 20, 2020, the disclosure of which is hereby incorporated herein by reference.

TECHNICAL FIELD

Embodiments of the invention relate to a component carrier in which a component is embedded and a method of manufacturing a component carrier.

TECHNOLOGICAL BACKGROUND

In order to reduce sizes of component carriers, active components are embedded in a stack made of several conductive or isolating layers. Hence, a balanced heat management in the package is necessary for the greatest possible computing power from the active components.

A component carrier, such as a printed circuit board (PCB) or a substrate, mechanically supports and electrically connects active and passive electronic components. Electronic components are typically mounted on the component carrier and are interconnected to form a working circuit or electronic assembly.

Component carriers can be single-sided or double-sided component carriers or can have a multi-layer design. Advantageously, multi-layer component carriers allow a high component density which becomes nowadays, in times of an ongoing miniaturization of electronic components, more and more important. Conventional component carriers known from the state of the art comprise a laminated stack with a plurality of electrically insulating layer structures and a plurality of electrically conductive layer structures. The electrically conductive layers are usually connected to each other by so called microvias or plated-through holes. A conductive copper layer on the surface of the laminated stack forms an exposed structured copper surface. The exposed structured copper surface of the laminated stack is usually covered with a surface finish which completely covers the exposed structured copper surface.

SUMMARY

There may be a need for improving the heat management of a component carrier.

This need may be met by the subject matter according to the independent claims. Advantageous embodiments of the present invention are described by the dependent claims.

According to a first embodiment of the invention, a component carrier is presented which comprises a stack comprising at least one electrically conductive layer structure and/or at least one electrically insulating layer structure, a component embedded in the stack, a first thermally conductive block above and thermally connected with the component and a second thermally conductive block below and thermally coupled with the component. The heat generated by the component during operation is removed via at least one of the first thermally conductive block and the second thermally conductive block or via both, the first thermally conductive block and the second thermally conductive block.

According to a further embodiment of the present invention, a method of manufacturing a component carrier is presented. According to the method, a stack is provided comprising at least one electrically conductive layer structure and/or at least one electrically insulating layer structure. A component is embedded in the stack. Next, a first thermally conductive block is thermally coupled with a top main surface of the component and a second thermally conductive block is thermally coupled with a bottom main surface of the component. The first thermally conductive block and the second thermally conductive block are arranged relative to the component so as to remove heat generated by the component during operation via at least one of the first thermally conductive block and the second thermally conductive block or via both, the first thermally conductive block and the second thermally conductive block.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane. In an embodiment, the component carrier is configured as one of the group consisting of a printed circuit board, a substrate (in particular an IC substrate), and an interposer.

The component embedded in the stack may be in particular an active component and may be defined as a component which rely on a source of energy (e.g., from a DC circuit) and usually may inject power into a circuit. Active components may include amplifying components such as transistors, triode vacuum tubes (valves), and tunnel diodes. Active components may be for example semiconductors, diodes, transistors, integrated circuits (ICs), optoelectronic devices, display technologies or kind of power sources.

Components incapable of controlling current by means of another electrical signal are called passive components. Resistors, capacitors, inductors, and transformers are considered as passive components. Passive components may, e.g., not introduce net energy into the circuit. Passive components may not rely on a source of power, except for what is available from a circuit they are connected to. As a consequence, passive components may not amplify (increase a power of a signal), although they may increase a voltage or current (such as is done by a transformer or resonant circuit). Passive components include two-terminal components such as resistors, capacitors, inductors, and transformers.

The thermally conductive blocks are formed of highly thermally conductive material, such as metal material, in particular copper, silver (e.g., formed on the basis of silver paste) or aluminum. Furthermore, thermally conductive material, such as a ceramic or plastic material including several fibers provided for the thermally conductive blocks as well. The respective blocks act as a thermal bridge between an inner component and an environment of the stack. The blocks may be electrically conductive or electrically isolating. In particular, the thermally conductive blocks are made from one material component and are integrally/monolithically formed. In other words, the thermally conductive blocks are made from one material block and may not comprise a layer structure.

Specifically, the component is embedded within the stack and/or arranged within the cavity/opening within the stack. The thermal conductive blocks are arranged in the stack in such a way that the component is arranged between the respective conductive blocks. Hence, from the first main surface of the component and from an opposing second main surface of the component, a high thermal transfer via the respective blocks to the environment is possible. In order to provide a proper thermal conductivity, at least the first thermal block and/or the second thermal block has a thickness bigger than at least one layer of the stack. For example, the thickness of the first thermal block and/or the second thermal block is bigger than $1/7$, in particular $1/6$ or $1/5$, of the overall thickness of the stack. Specifically, the thickness of the respective blocks may be for example more than in particular 300 μm or more than 500 μm (micrometers) and for example up to 1 mm (millimeter). The thickness of the stack is defined parallel to a stacking direction of the layers of the stack. The thickness of the block may be defined in relation to a capability of heat spreading. Assuming a heat spreading angle of approx. 45°, where thermal flux can be distributed in a thermal block, the heat spreading effect can be adjusted by the thickness of the block. Hence, due to the thick formation of the respective blocks, an improved heat transfer from the component to the environment is achieved from both sides of the component.

Hence, by embodiments the present invention, the combination of embedding active components with double-sided cooling with a copper block and single or double-sided current carrying support may be provided. Specifically, an improved thermal conductivity to a heat sink on the one side and a high current carrying capability of moderate costs for power system on the other side may be provided.

According to further exemplary embodiment, at least one of the first and the second thermally conductive blocks is electrically conductive and connected to the component for transmitting electric signals between the component and said at least one of the first and the second thermally conductive blocks. In other words, one or both electrically conductive blocks may have additionally the function of conducting electric signals. Hence, a respective block may have the function to transport thermal energy from the component to the environment and additionally to transport electric signals between the component and the further conductive structure such as a conductive layer, or a further component. The transmission of electric signals may also include a supply of electric energy to the component. Specifically, due to the thick design of a respective thermally conductive block, high current can be transmitted between a component and a surrounding electronic structure.

According to further exemplary embodiment, at least one of the first and the second thermally conductive blocks is embedded in the electrically insulating layer structure of the stack, and comprises a main surface being thermally coupled to an environment of the stack. Hence, the respective main surface of the respective conductive block thermally coupled to the environment of the stack can be directly coupled to an external thermally conductive structure or an active/or passive cooling structure and a heat sink, respectively.

According to further exemplary embodiment, at least one electrically insulating layer of the at least one electrically insulating layer structure is arranged above the first thermally conductive block. The at least one electrically insulating layer is in particular configured for forming a thermally conductive and electrically isolating interface to the environment. In other words, the electrically isolating layer covers respective main surface of a respective thermally conductive block, such that electrically isolating layer electrically isolates the thermally (and for example also electrically) conductive block from the environment of the stack. Hence, a heat sink for example made of electrically conductive material, such as copper, may be attached to the stack without causing an electrical conduction between the heat sink and the respective thermally conductive block.

According to further exemplary embodiment, the electrically insulating layer comprises a resin layer and/or a thermal prepreg, in particular filled with AlN or AlO particles, having a thermal conductivity in particular between 2 W/mK and 30 W/mK.

According to further exemplary embodiment, the component carrier further comprises a heat sink connected to an upper main surface of the stack (which is closest to the environment), in particular to said electrically insulating layer structure or (e.g. directly) said first thermally conductive block. The heat sink may be made of a block of thermally conductive material, such as copper. Additionally, the heat sink may comprise a plurality of cooling fins in order to increase the cooling surface. The heat sink may be a passive cooling device. Alternatively, the heat sink may also be an active cooling device, comprising cooling channels for supplying a cooling fluid or comprising a ventilator for improving cooling air circulation.

According to further exemplary embodiment, a thickness of a portion of the electrically insulating layer structure of the stack between the first thermally conductive block or the second thermally conductive block on the one side and the environment on the other side is at least 100 μm. In other words, a thickness of a portion of the electrically insulating layer structure of the stack between one of the first thermally conductive block and the second thermally conductive block and the environment is at least 100 μm or more, depending on the material used and desired voltage/current. Hence, a distance of the outer surface of the respective thermally conductive block and the environment and the outer surface of the stack, respectively, is increased such that also electrical isolation between the environment and the respective block or more than 1200 volts may be provided. By increasing the distance between the thermally conductive block and the environment, high-voltage applications and respective high voltage components embedded in the stack can be used.

According to further exemplary embodiment, the component carrier further comprises at least one further thermally conductive block placed side by side with at least one of the first thermally conductive block and the second thermally conductive block. For example, the thermally conductive blocks may be also electrically conductive or may transmit respective electronic signals between the component and other electrically conductive structures of the component carrier. The thermally conductive blocks can form for example respective drain, source, and gate terminals of the component, e.g., a MOSFET.

According to further exemplary embodiment, at least one of the electrically insulating layer structures has a cavity accommodating the first thermally conductive block. According to further exemplary embodiment, at least one of the electrically insulating layer structures has a further cavity accommodating the second thermally conductive block. Hence, the respective portions of the electrically insulating layer structure comprise a respective accommodation cavity for accommodating the respective thermally conductive block. The cavity may be formed by laser drilling or by etching technologies. Furthermore, the respective portion of the electrically isolating layer structure may be formed layer by layer while keeping the respective cavity free of electrically insulating layers. If the respective portion of the electrically isolating layer structure is made for example of thermally conductive resin or prepreg, the respective blocks may be embedded in the respective portion of the electrically isolating layer structure.

Specifically, according to a further exemplary embodiment of the method, the electrically insulating layer structure comprises a top insulating layer structure, in particular comprises a thermally conductive prepreg or resin. The top electrically insulating layer structure has a cavity for accommodating the first thermally conductive block. According to the method, the top electrically insulating layer structure is arranged after the first thermally conductive block is arranged relative to the component such that the first thermally conductive block is accommodated within the cavity. In other words, when arranging the top electrically isolating layer structure to the stack portion which embeds the component, the respective thermally conductive block is already mounted and fixed onto the stack portion. For example, if the cavity is larger than the respective thermally conductive block, the gaps between the walls of the cavity and the thermally conductive block may be filled with thermally conductive resin, for example.

According to further exemplary embodiment, the component carrier further comprises a planar electrically conductive layer between the component and at least one of the first thermally conductive block and the second thermally conductive block, wherein the planar electrically conductive layer is in particular thicker than 35 μm. The planar electrically conductive layer may be used for transmitting signals between the component and to further structure or functional element electrically connected to the planar electrically conductive layer. Besides the electrically conductive function, the planar electrically conductive layer may also be thermally conductive such that thermal energy may be transferred from the component via the electrically conductive layer to the respective first and second thermally conductive block. In a further exemplary embodiment, the respective first or second thermally conductive block may also be electrically conductive such that signals may be transmitted between the component via the planar electrically conductive layer and the respective first or second thermally conductive block.

Furthermore, in order to transmit high-current signals, the planar electrically conductive layer may have a thickness of more than 35 μm (micrometers), in particular more than 70 μm or 100 μm. The planar electrically conductive layer may be formed by plating with one or several plating steps in order to achieve the desired thickness of the electrically conductive layer. Also, thick copper foils may be used for forming the planar electrically conductive layer. Other procedures of copper application or deposition may be used as well. However, in order to reduce the amount of plating steps for plating the planar electrically conductive layer, the respective first or second thermally conductive block which may be electrically conductive and may be thermally and electrically coupled to the planar electrically conductive layer may function as a proper high-current transmitter such that the respective first or second thermally conductive block supports even thin planar electrically conductive layers having for example a thickness of 35 μm to transmit high currents.

According to further exemplary embodiment, the component is a semiconductor chip, in particular a power semiconductor chip, more particularly one of the group consisting of an IGBT, a MOSFET, a HEMT, a silicon chip, a gallium nitride chip and a silicon carbide chip. Furthermore, the components may consist of further gallium-based compounds (in particular gallium nitrides, gallium oxides) as well as further silicon-based compounds (in particular silicon carbides, silicon oxides).

According to further exemplary embodiment of the method, at least one of the first thermally conductive block and the second thermally conductive block is thermally coupled relative to the component by ultrasound bonding, sintering, soldering, attachment through adhesive layers or other thermal interface materials.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Del., U.S.A. Reinforcing structures such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high-frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

The aspects defined above and further aspects of the present invention are apparent from the examples of embodiment to be described hereinafter and are explained with reference to the examples of embodiment. The invention will be described in more detail hereinafter with reference to examples of embodiments but to which the invention is not limited.

DETAILED DESCRIPTION OF ILLUSTRATED EMBODIMENTS

Figure 1:
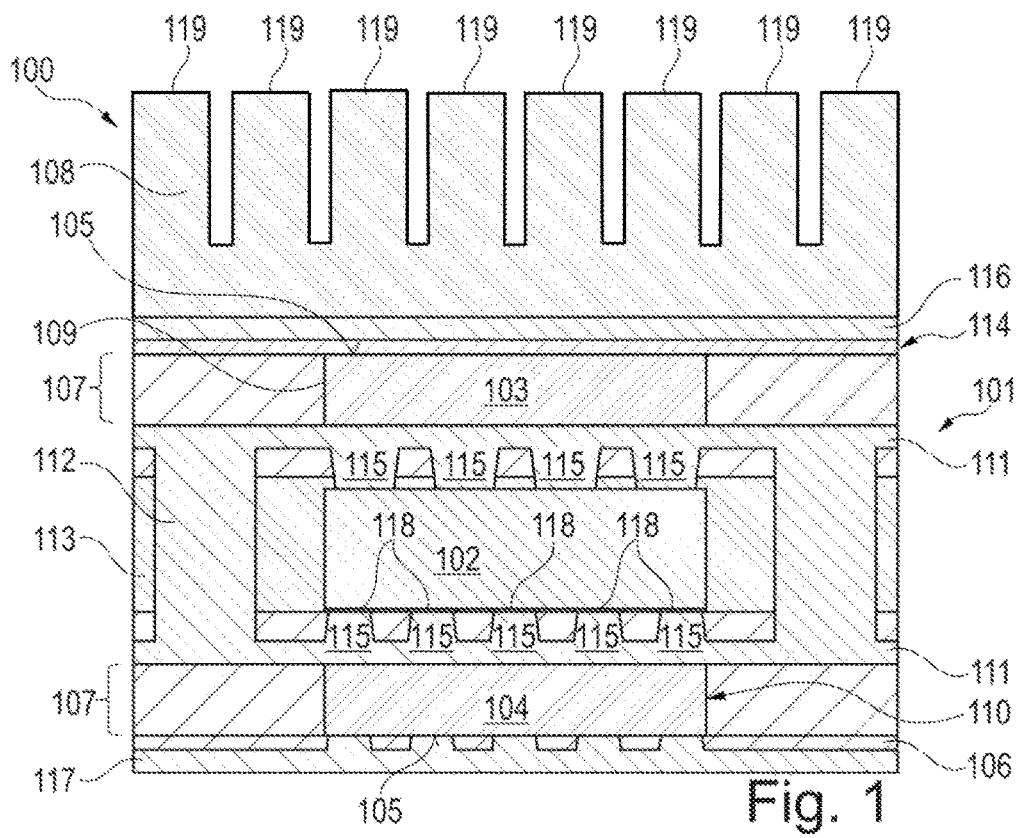
FIG. 1 illustrates a component carrier comprising two thermally conductive blocks as well as a heat sink according to an embodiment of the present invention.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different than those illustrated in the figures when in use.

FIG. 1 shows a component carrier 100 comprising two thermally conductive blocks 103, 104 as well as a heat sink 108 according to an embodiment of the present invention.

The component carrier 100 comprising a stack 101 comprising at least one electrically conductive layer structure and/or at least one electrically insulating layer structure. A component 102 is embedded in the stack 101. The component carrier 100 further comprises a first thermally conductive block 103 above and thermally connected with the component 102 and a second thermally conductive block 104 below and thermally coupled with the component 102. The heat generated by the component 102 during operation is removed via both the first thermally conductive block 103 and the second thermally conductive block 104.

The component carrier 100 is a support structure which is capable of accommodating one or more components 102 thereon and/or therein for providing mechanical support and/or electrical connectivity. In other words, a component carrier 100 may be configured as a mechanical and/or electronic carrier 100 for components 102.

The component carrier 100 comprises a stack 101 of at least one electrically insulating layer structure and at least one electrically conductive layer structure. For example, the component carrier 100 may be a laminate of the mentioned electrically insulating layer structure(s) and electrically conductive layer structure(s), in particular formed by applying mechanical pressure and/or thermal energy. The mentioned stack 101 may provide a plate-shaped component carrier 101 capable of providing a large mounting surface for further components and being nevertheless very thin and compact. The term "layer structure" may particularly denote a continuous layer, a patterned layer, or a plurality of non-consecutive islands within a common plane.

The component 102 embedded in the stack 101 may be in particular an active component and may be defined as a component which rely on a source of energy (e.g., from a DC circuit) and usually may inject power into a circuit.

The thermally conductive blocks 103, 104 are formed of highly thermally conductive material, such as metal material, in particular copper or aluminum. Furthermore, thermally conductive material, such as a ceramic or plastic material may include thermally conductive fibers provided for the thermally conductive blocks 103, 104 as well. The respective blocks 103, 104 act as a thermal bridge between the inner component 102 and an environment of the stack 101, e.g., to and via the heat sink 108. The thermally conductive blocks 103, 104 are made from a single material component and are integrally/monolithically formed.

The component 102 is embedded within the stack 101 and arranged within the opening within the stack 101, respectively. The thermal conductive blocks 103, 104 are arranged in the stack 101 in such a way that the component 102 is arranged between the respective conductive blocks 103, 104. Hence, from the first main surface of the component and from an opposing second main surface of the component, a high thermal transfer via the respective blocks 103, 104 to the environment is possible. In order to provide a proper thermal conductivity, at least the first thermal block 103 and/or the second thermal block 104 has a thickness bigger than at least one layer of the stack 101. Hence, due to the thick formation of the respective blocks 103, 104 a proper heat transfer from the component 102 to the environment is achieved from both sides of the component 102.

In the exemplary embodiment shown in FIG. 1, the second thermally conductive block 104 is electrically conductive and connected to the component 102 for transmitting electric signals between the component 102 and the second thermally conductive block 104. Hence, the second thermally conductive block 104 transports thermal energy from the component 102 to the environment and additionally to transport electric signals between the component 102 and to further conductive structures such as an electrically conductive interface layer 117. The transmission of electric signals may also include a supply of electric energy to the component 102. Specifically, due to the thick design of a second thermally conductive block 104, high voltage can be transmitted between the component 102 and the electrically conductive interface layer 117. The electrically conductive interface layer 117 may form an external plane which can be used for signal routing, for example for Gate-Drive-Circuits.

The first and the second thermally conductive blocks 103, 104 are embedded in the electrically insulating layer structure of the stack 101, and comprise respective outer main surface being thermally coupled to an environment of the stack 101. Hence, in the exemplary embodiment shown in FIG. 1, the main surface of the first thermally conductive block 103 is thermally coupled to an active and/or passive cooling structure and a heat sink 108, respectively. The main surface of the second thermally conductive block 104 is thermally and also electrically coupled to a respective electrically conductive interface layer 117.

Furthermore, as can be taken from FIG. 1, the electrically conductive interface layer 117 is coupled to the electrically conductive second thermally conductive block 104 by respective vertical connections (vias).

At least one electrically insulating layer 106 of the at least one electrically insulating layer structure is arranged above the second thermally conductive block 104. The at least one electrically insulating layer 106 is in particular configured for forming a thermally conductive and electrically isolating interface to the environment. In other words, the electrically isolating layer 106 at least partially covers the outer main surface of the second thermally conductive block 104, such that the electrically isolating layer 106 electrically isolates the thermally (and for example also electrically) conductive block 104 from the environment of the stack 101. Furthermore, electrically conductive structures 117 of the component carrier 100 can be arranged onto the electrically isolating layer 106. Between the second thermally conductive blocks 104, 201 and electrically conductive structures 117, via connections can be formed for providing an electrical and thermal coupling between the second thermally conductive blocks 104, 201 and electrically conductive structures 117.

Furthermore, a further electrically insulating layer 114 may be arranged on top of the stack 101 which covers the outer main surface of the first thermally conducting block 103 and the stack 101. The electrically isolating layer 114 may be highly thermally conductive but electrically isolating. Hence, on top of the electrically isolating layer 114, a heat sink 108, such as an active or passive cooler, may be attached, wherein only thermal energy is supplied to the heat sink 108. The electrically isolating layer 114 may be made of the thermal pre-product or a resin sheet and function as a heat spreader.

The heat sink 108 may therefore made of electrically and thermally conductive material, such as copper, and may be attached to the stack 101 without causing an electrical conduction between the heat sink 108 and the respective thermally conductive block 103. Additionally, the heat sink 108 may comprise a plurality of cooling fins 119 in order to increase the cooling surface. Alternatively, the heat sink 108 may be a block comprising a rectangular shape, i.e., with a flat top surface without protruding fins 119. The heat sink 108 may be a passive cooling device. Alternatively, the heat sink 108 may also be an active cooling device comprising cooling channels for supplying a cooling fluid or comprising a ventilator for improving cooling air circulation. Furthermore, between the further electrically insulating layer 114 and the heat sink 108, a further thermally conductive layer 116 may be arranged. Hence, thermal energy from the further electrically insulating layer 114 may be listed and distributed along the surface of the further thermally conductive layer 116. For example, the further thermally conductive layer 116 may also be electrically conductive.

A thickness of a portion of the electrically insulating layer structure of the stack 101 between one of the first thermally conductive block 103 and the second thermally conductive block 104 and the environment is at least 100 µm, depending on the material used and desired voltage to be applied. Hence, a distance of the outer surface of the respective thermally conductive block 103, 104 and the environment and the outer surface of the stack 101, respectively, is increased such that also electrical isolation between the environment and the respective block 103, 104 or more than 1200 volts may be provided.

As can be taken from FIG. 1, an outer top section of the electrically insulating layer structure 107 has a cavity 109 accommodating the first thermally conductive block 103. An outer bottom section of the electrically insulating layer structure 107 has a further cavity 110 accommodating the second thermally conductive block 104. The cavities 109, 110 may be formed by laser drilling or by etching technologies. The top and/or bottom section of the electrically insulating layer structure 107 are made for example of thermally conductive resin or prepreg, wherein the respective thermally conductive blocks 103, 104 may be embedded in the respective portion of the electrically isolating layer structure 107. The stack 101 may be formed by stacking electrically isolating layers, such as prepreg layers, and respective electrically conductive layers, such as copper foils, and the electrically distribution structure 112, respectively, for forming a core 113 of the stack 101. Additionally, the component 102 may be included into the core 113 of the stack 101 and the thermally conductive blocks 103, 104 are arranged on top or bottom to the respective stacked core 113 of the stack 101. Next, a further preassembled stacked block of layers 107, 117 including the respective cavity 109 is put over the respective thermally conductive blocks 103, 104 arranged on top of the already stacked layers forming the core 113 of the stack 101. The preassembled stacked block of layers 107, 117 may also include the outer electrically insulating layer 106 and/or electrically conductive structures 117 (such as a copper foil) having no cavity for covering the respective thermally conductive blocks 103, 104. Additionally, in the stacked block of layers 107, 117, the via for connecting the electrically conductive structures 117 with the respective thermally conductive blocks 103, 104 may also already be formed before coupling to the respective thermally conductive blocks 103, 104 and the core of the stack 101, respectively.

Specifically, the top/bottom electrically insulating layer 107 structure may be arranged to a core 113 of the stack 101 after the first thermally conductive blocks 103, 104 are arranged relative to the component 102 such that the first thermally conductive block 103 is accommodated within the cavity 109 and the second thermally conductive block 104 is accommodated within the further cavity 110. In other words, when arranging the top/bottom electrically isolating layer structure 107 to the stack portion (i.e., core section 113) which embeds the component 102, the respective thermally conductive blocks 103, 104 are already mounted and fixed onto the stack portion 113. For example, if the cavity 109, 110 is larger than the respective thermally conductive block 103, 104, the gaps between the walls of the cavity 109, 110 and the thermally conductive block 103, 104 may be filled with thermally conductive material such as thermally conductive resin, for example.

The component carrier 100 further comprises a planar electrically conductive layer 111 between the component 102 and the first thermally conductive block 103 and the second thermally conductive block 104, wherein the planar electrically conductive layer 111 is in particular thicker than 35 µm. The planar electrically conductive layer 111 transmits signals between the component 102 and to further structures or functional elements electrically connected to the planar electrically conductive layer 111. Besides the electrically conductive function, the planar electrically conductive layer 111 is also thermally conductive such that thermal energy may be transferred from the component 102 via the electrically conductive layer 111 to the respective first and second thermally conductive blocks 103, 104.

The respective first and/or second thermally conductive block 103, 104 may also be electrically conductive such that signals may be transmitted between the component 102 via the planar electrically conductive layer 111 and the respective first or second thermally conductive block 103, 104.

Furthermore, the stack 111 comprises a thermal and/or electrically distribution structure 112. The electrically distribution structure 112 comprises for example vertical connections between the respective planar electrically conductive layers 111. The electrically distribution structure 112 comprises furthermore thermal connections 115 between the component 102 and the respective planar electrically conductive layers 111 and the respective thermally conductive blocks 103, 104. additionally, the thermal connections 115 may be electrically conductive and may be connected for example to respective terminals 118 of the component 102 in order to transmit signals and in particular high-voltage, respectively.

Figure 2:
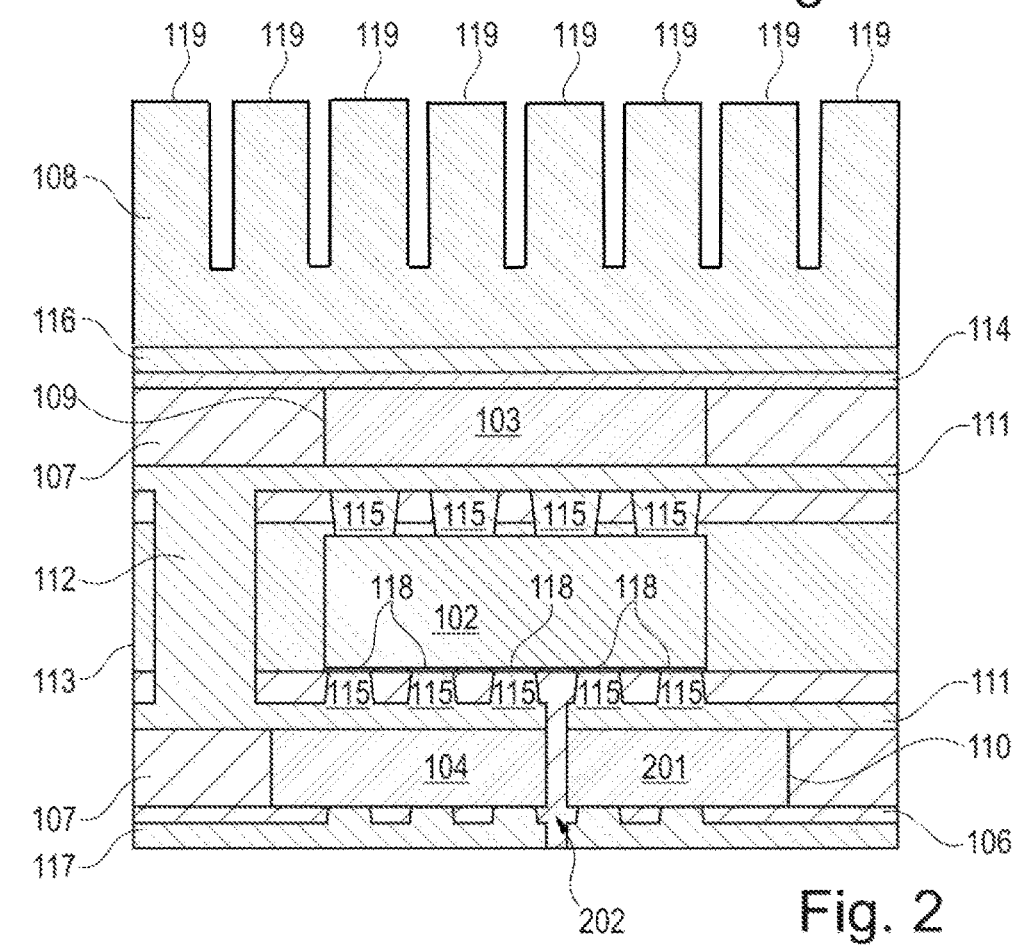
FIG. 2 illustrates a component carrier comprising three thermally conductive blocks as well as a heat sink according to an embodiment of the present invention.

FIG. 2 illustrates a component carrier 100 comprising three thermally conductive blocks 103, 104, 201 as well as a heat sink 108 according to an embodiment of the present invention. The component carrier 100 comprises a stack 101 which is formed in a similar manner as the stack 101 in FIG. 1.

However, separated by a gap 202 from the second thermally conductive block 104, further thermally conductive block 201 is arranged and accommodated within the bottom electrically insulating layer structure 107. In other words, the further thermally conductive block 201 is placed side by side with the second thermally conductive block 104. For example, the thermally conductive blocks 103, 104, 201 may be also electrically conductive or transmitting respective electronic signals between the component 102 and other electrically conductive structures 117 of the component carrier 100. The thermally conductive blocks 103, 104, 201 can form for example respective drain, source, and gate terminals of the component, e.g., a MOFSET.

Figure 3:
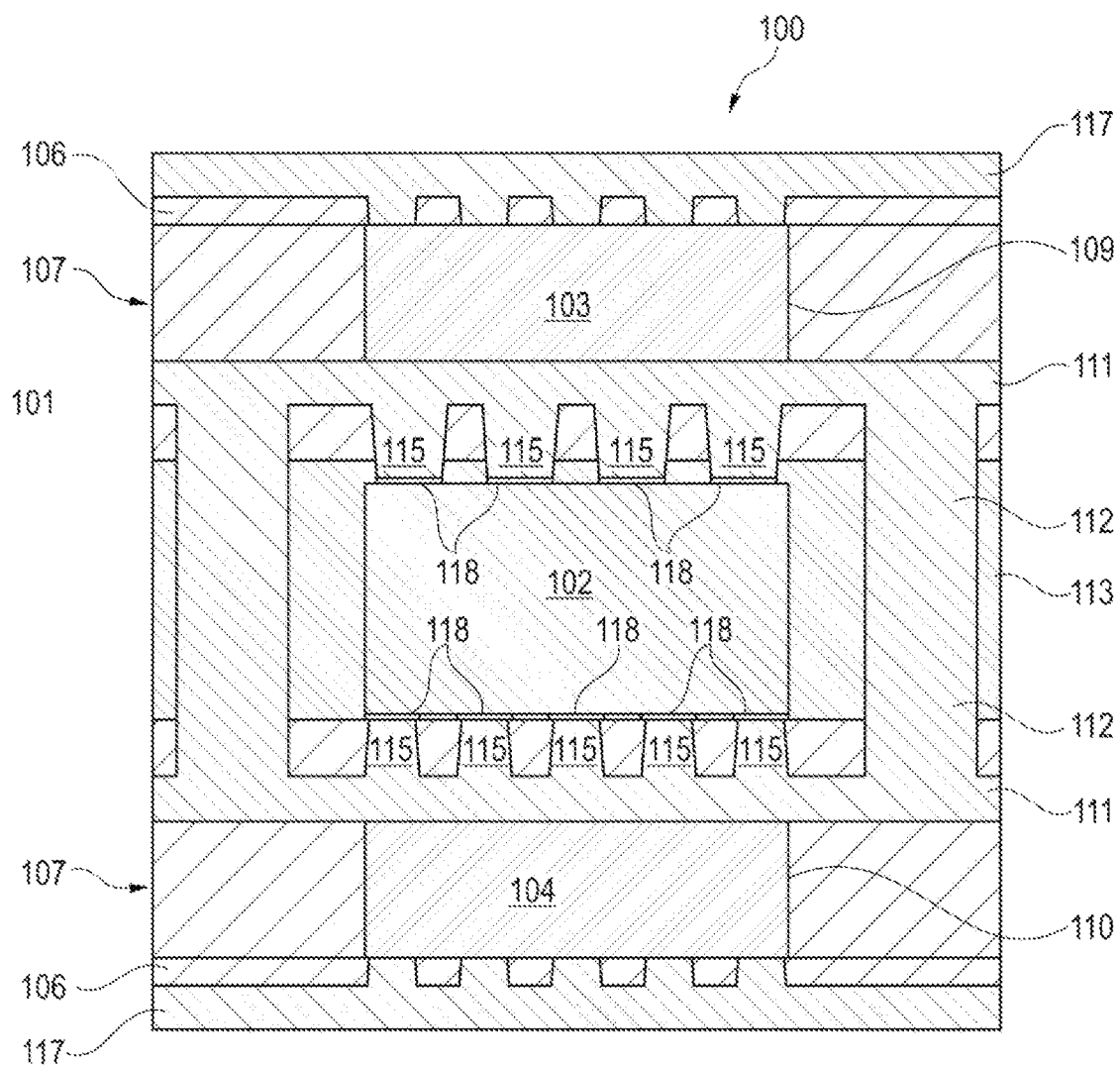
FIG. 3 illustrates a component carrier comprising two thermally conductive blocks adapted for transmitting signals according to an embodiment of the present invention.

FIG. 3 illustrates a component carrier 100 comprising two thermally conductive blocks 103, 104 adapted for transmitting signals according to an embodiment of the present invention. The component carrier 100 comprises a stack 101 which is formed in a similar manner as the stack 101 in FIG. 1.

However, instead of an upper heat sink 108, the component carrier 100 in FIG. 3 comprises a further above electrically conductive interface layer 117. Hence, the component 102 may comprise on both opposing main surfaces respective terminals 118 for signal transmitting. Accordingly, an electrically conductive connection may be provided between the planar electrically conductive layer 111 of the thermal distribution structure 112. Furthermore, the first thermally conductive structure 103 and the second thermally conductive block 104 may be electrically conductive such that the respective signals to can be transmitted between the electrically conductive interface layers 117 and the component 102. Additionally, high thermal energy may be transported between the component 102 and the outer electrically conductive interface layers 117, such that also high voltage and high current may be transmitted to or from the embedded component 102.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE NUMERALS 100 component carrier
101 stack
102 component
103 first thermally conductive block
104 second thermally conductive block
105 main surface
106 electrically insulating layer
107 top/bottom electrically insulating layer structure, thermal prepreg
108 heat sink
109 cavity
110 further cavity
111 planar electrically conductive layer
112 thermal distribution structure
113 core
114 further electrically insulating layer
115 thermal connections
116 further thermally conductive layer
117 electrically conductive interface layer
118 connection terminal of component
119 cooling fin
201 further thermally conductive block
202 gap

The invention claimed is:

1. A component carrier, comprising:
a stack comprising at least one electrically conductive layer structure and/or at least one electrically insulating layer structure;
a component embedded in the stack;
a first thermally conductive block above and thermally connected with the component, the first thermally conductive block having a first main surface; and
a second thermally conductive block below and thermally coupled with the component;
wherein heat generated by the component during operation is removed via at least one of the first thermally conductive block and the second thermally conductive block,
wherein at least one electrically insulating layer of the at least one electrically insulating layer structure is arranged above the first thermally conductive block,
wherein the at least one electrically insulating layer covers the main surface of the first and/or the second thermally conductive blocks to form a thermally conductive and electrically isolating interface to the environment of the stack,
wherein at least one electrically conductive layer of the stack and the first thermally conductive block are located adjacent to one another and between the at least one electrically insulating layer and the component with opposed surfaces of the first thermally conductive block respectively facing the at least one insulating layer and the at least one electrically conductive layer,
wherein at least one electrically insulating layer of the at least one electrically insulating layer structure has a further cavity accommodating the second thermally conductive block.

2. The component carrier according to claim 1,
wherein at least one of the first and the second thermally conductive blocks is electrically conductive and connected to the component for transmitting electric signals between the component and said at least one of the first and the second thermally conductive blocks.

3. The component carrier according to claim 1,
wherein at least one of the first and the second thermally conductive blocks is embedded in the electrically insulating layer structure of the stack, and wherein a main surface of at least one of the first and the second thermally conductive blocks is thermally coupled to an environment of the stack.

4. The component carrier according to claim 1,
wherein the electrically insulating layer comprises a resin layer and/or a thermal prepreg having a thermal conductivity between 2 W/mK and 30 W/mK.

5. The component carrier according to claim 1, further comprising:
a heat sink connected to an upper main surface of the stack.

6. The component carrier according to claim 1,
wherein a thickness of said electrically insulating layer structure of the stack between one of the first thermally conductive block and the second thermally conductive block and the environment is at least 100 μm.

7. The component carrier according to claim 1, further comprising:
at least one further thermally conductive block placed side by side with at least one of the first thermally conductive block and the second thermally conductive block.

8. The component carrier according to claim 1,
wherein at least one electrically insulating layer of the at least one electrically insulating layer structure has a cavity accommodating the first thermally conductive block.

9. The component carrier according to claim 1, further comprising:
a planar electrically conductive layer between the component and at least one of the first thermally conductive block and the second thermally conductive block.

10. The component carrier according to claim 9,
wherein the planar electrically conductive layer is thicker than 35 μm.

11. A method of manufacturing a component carrier, comprising:
providing a stack comprising at least one electrically conductive layer structure and/or at least one electrically insulating layer structure;
embedding a component in the stack;
thermally coupling a first thermally conductive block with a top main surface of the component;
thermally coupling a second thermally conductive block with a bottom main surface of the component;
arranging the first thermally conductive block and the second thermally conductive block relative to the component so as to remove heat generated by the component during operation via at least one of the first thermally conductive block and the second thermally conductive block,
wherein at least one electrically insulating layer of the at least one electrically insulating layer structure is arranged above the first thermally conductive block,
wherein the at least one electrically insulating layer covers the main surface of the first and/or the second thermally conductive blocks to form a thermally conductive and electrically isolating interface to the environment of the stack,
wherein at least one electrically conductive layer of the stack and the first thermally conductive block are located adjacent to one another and between the at least one electrically insulating layer and the component with opposed surfaces of the first thermally conductive block respectively facing the at least one insulating layer and the at least one electrically conductive layer,
wherein at least one electrically insulating layer of the at least one electrically insulating layer structure has a further cavity accommodating the second thermally conductive block.

12. The method according to claim 11,
wherein the electrically insulating layer structure comprises a top insulating layer structure,
wherein the top electrically insulating layer structure has a cavity for accommodating the first thermally conductive block,
the method, further comprising:
arranging the top electrically insulating layer structure after the first thermally conductive block is arranged relative to the component such that the first thermally conductive block is accommodated within the cavity.

13. The method according to claim 11,
wherein at least one of the first thermally conductive block and the second thermally conductive block is thermally coupled relative to the component by ultrasound bonding, sintering, soldering or attachment through adhesive layers.

* * * * *